United States Patent
Bedeschi

(10) Patent No.: US 8,971,105 B2
(45) Date of Patent: Mar. 3, 2015

(54) METHODS AND APPARATUSES FOR CONTROLLING MEMORY WRITE SEQUENCES

(71) Applicant: Micron Technology, Inc., Boise, ID (US)

(72) Inventor: Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/799,312

(22) Filed: Mar. 13, 2013

(65) Prior Publication Data

US 2014/0269044 A1    Sep. 18, 2014

(51) Int. Cl.
*G11C 11/00*    (2006.01)
*G11C 13/00*    (2006.01)

(52) U.S. Cl.
CPC ................................ *G11C 13/0069* (2013.01)
USPC ........................................... 365/163; 365/148

(58) Field of Classification Search
CPC ........................ G11C 13/0004; G11C 13/0069
USPC .................................................. 365/163, 148
See application file for complete search history.

(56) References Cited

U.S. PATENT DOCUMENTS 8,085,584 B1    12/2011    Kale et al.
2010/0165729 A1*  7/2010    Lee et al. ...................... 365/163

* cited by examiner

*Primary Examiner* — Huan Hoang
(74) *Attorney, Agent, or Firm* — Knobbe, Martens, Olson & Bear, LLP

(57) ABSTRACT

Subject matter disclosed herein relates to memory operations regarding changing an order of program bits to be programmed into a memory array.

26 Claims, 6 Drawing Sheets

METHODS AND APPARATUSES FOR CONTROLLING MEMORY WRITE SEQUENCES

FIELD

Subject matter disclosed herein relates to memory operations regarding encoding program bits to be programmed into a memory array.

BACKGROUND

Memory devices may be employed in various electronic devices, such as computers, cell phones, PDA's, data loggers, and/or navigational equipment, just to name a few examples. For example, various types of nonvolatile memory devices may be employed, such as solid state drives (SSD), NAND or NOR flash memory, or phase change memory, among others. In general, writing or programming operations may be used to store information, while read operations may be used to retrieve stored information.

Phase change memory (PCM) may operate based, at least in part, on behavior or properties of one or more particular phase change materials, such as chalcogenide glass or germanium antimony telluride (GST), just to name a few examples. Electrical resistivities of crystalline or amorphous states of such materials may be different from one another, thus presenting a basis for distinguishing information states. For example, an amorphous, high resistance state may represent a stored first binary state and a crystalline, low resistance state may represent a stored second binary state. Of course, such a binary representation of stored information is merely an example: Phase change memory may also be used to store multiple memory states, represented by varying degrees of phase change material resistivity, for example.

Non-volatile memory may involve asymmetrical latencies between storing data of '1' and '0' due to technology limitations and/or intentional design of such memory. For example, a PCM device may take longer to store a one-bit (if a one-bit represents a relatively low resistance, crystalline state) than to store a zero-bit (if a zero-bit represents a relatively high resistance, amorphous state). Also, within a given system, from the same memory, some applications may involve faster storage of one-bits while other applications may involve faster storage of zero-bits.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
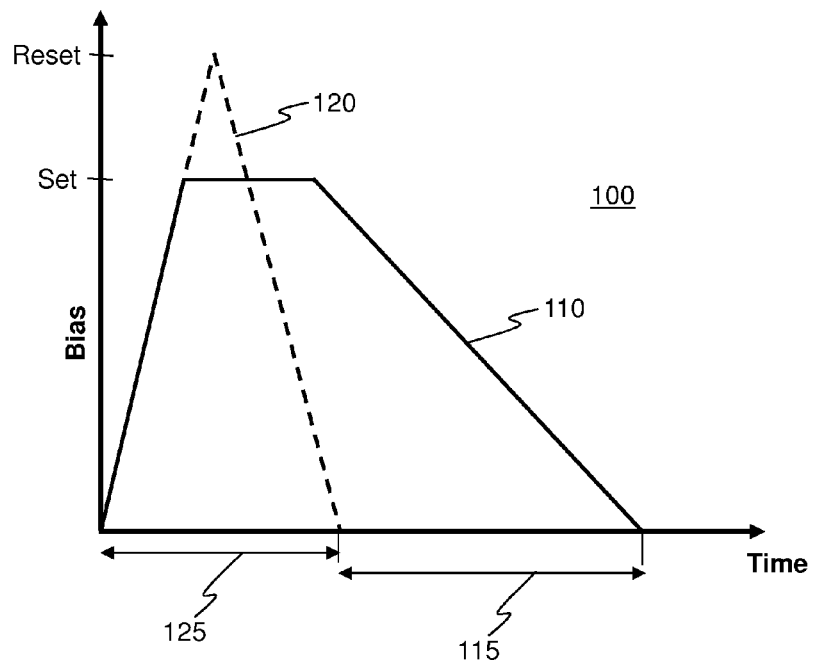
FIG. 1 is a plot of characteristics of bias signal waveforms, according to an embodiment.

Reference throughout this specification to "one embodiment" or "an embodiment" means that a particular feature, structure, or characteristic described in connection with an embodiment is included in at least one embodiment of claimed subject matter. Thus, appearances of phrases such as "in one embodiment" or "an embodiment" in various places throughout this specification are not necessarily all referring to the same embodiment. Furthermore, particular features, structures, or characteristics may be combined in one or more embodiments.

Embodiments are described herein for methods and apparatuses for programming memory. In certain embodiments, memory systems are described having different programming latency for zero-bit and one-bit data. However, the skilled artisan will appreciate that the latency in each state depends upon the characteristics of programming the information state for particular memory cell technologies, such as conversion to crystalline vs. conversion to amorphous states for PCM, rather than the labels "1" or "0" (or one-bit or zero-bit) for the information states, which can be arbitrarily assigned. Moreover, the skilled artisan will appreciate that the processes described herein are applicable to memory systems with more than two states and are not limited to binary systems. Accordingly, the skilled artisan can readily apply the teachings herein with respect to programming bits of binary data more generally to programming of digits of more complex logic systems A phase change memory (PCM) cell, if used to store a binary logic value, may be set or reset to one of two states in a particular example embodiment. For example, an amorphous state may represent a stored first binary state (e.g., a zero-bit) and a crystalline state may represent a stored second binary state (e.g., a one-bit), where the amorphous state has a higher resistance than the crystalline state. A PCM cell may be programmed to a zero-bit by resetting the PCM cell to an amorphous state by applying a relatively high amplitude, relatively short duration electrical programming pulse or signal so as to melt and then cool the phase change material of the PCM cell. A PCM cell may be programmed to a one-bit by setting the PCM cell to a crystalline state by crystallizing phase change material. Programming to a one-bit by crystallizing can also be accomplished by heating; however, crystallizing (setting to a one-bit) tends to require a longer programming pulse, compared to a programming to an amorphous state (resetting to a zero-bit). Heating for either reset or crystallizing functions can be conducted by running current through a resistive heater element in proximity to the PCM material, or in a self-heating arrangement by running current through the PCM material itself.

As described in further detail below, programming a memory device may involve asymmetrical programming latencies, wherein bits of one type may be programmed in a longer time than bits of another type. In some embodiments, the programming time for bits of one type can be more than twice the programming time for bits of another type. For example, in one implementation of a PCM array, latency to program a bit of one type (e.g., one-bit) may be about 500.0 nanoseconds, whereas latency to program a bit of another type (e.g., zero-bit) may be about 50.0 nanoseconds. Accordingly, the program speed of such a memory device may be improved by reducing a number of one-bits in a plurality of bits to be programmed in the memory device. In one implementation, reducing a number of one-bits may be accomplished by encoding a plurality of bits (comprising one-bits and zero-bits, for example) to be programmed. Though such encoding may reduce a number of one-bits, the overall number of bits to be programmed may increase, since bits involved in the encoding may be added to the original number of program bits. Even though an overall number of bits to be programmed may increase, program speed of a memory device may nevertheless be improved, depending, at least in part, on any difference in latency between programming a zero-bit versus programming a one-bit.

Independently of, or in addition to encoding program bits to reduce a number of one-bits to improve program speed of a memory device, another technique to improve program speed may include changing an order of writing program bits to a memory cell array relative to the sequence of received program bits. For example, changing the order of writing can include programming all zero-bits of the program bits before programming remaining one-bits (or vice versa). Separating operations to program all zero-bits and program all one-bits, for example, may improve program speed because bits programmed simultaneously in parallel (e.g., a byte or a word) comprising only zero-bits may be programmed faster than the case where the bits programmed in parallel include one or more one-bits. For example, program speed of parallel bits (e.g., a byte or a word) that include merely a single one-bit among a plurality of zero-bits may be the same as program speed of the parallel bits that include all one-bits. In other words, even a single one-bit may slow program speed. Accordingly, a plurality of bits to be programmed may be arranged so that any zero-bits are programmed before programming one-bits, as described in detail below, or vice versa.

As mentioned above, in an embodiment, reducing a number of bits of one type (e.g., one-bits or zero-bits) in a plurality of bits to be written to said memory cell array may provide benefits such as improving speed of storing write data by taking advantage of asymmetrical latencies that may be associated with a particular memory device. For example, for PCM, a process to store one-bits may be slower than a process to store zero-bits. Accordingly, it may be beneficial to reduce a number of one-bits in a plurality of bits prior to writing the bits to a PCM. In another example, memory sectors of memory devices (e.g., flash memory) may be initialized with background data comprising all one-bits (subsequent to an erase process, for example). Applications, which may utilize such a memory device during execution, for example, may benefit from faster storage of zero-bits. Accordingly, it may be beneficial to reduce a number of one-bits in a plurality of bits prior to writing to such a memory device. Thus, configuring bits of data (e.g., reducing a number of one-bits) may provide a benefit of achieving improved performance of a memory device in terms of write/read latencies, for example, by exploiting a memory device's inherent asymmetrical latency between storing one-bits and zero-bits. Of course, such details and advantages of configuring data to store in memory are merely examples, and claimed subject matter is not so limited. The skilled artisan will appreciate that benefits of sequencing program order to program bits of one type prior to bits of another type can be obtained even without encoding to minimize one type of bit.

In an embodiment, a method to improve speed of writing program bits to memory by taking advantage of asymmetrical latencies that may be associated with a particular memory device may comprise writing bits of one information state (e.g., zero-bits) to a memory cell array before writing bits of another information state (e.g., one-bits) to the memory cell array, as described in detail below. It will be understood that, in some implementations, one-bits may be written to a memory cell array before writing the zero-bits to the memory cell array.

In one implementation, program data to be written to a memory cell array (also referred to herein as "program bits") may be encoded in a manner that reduces a number of digits of one information state (e.g., zero-bits or one-bits). Though claimed subject matter is not so limited, encoding particular program bits to be written into a memory cell array may comprise using a table to associate encoded data (e.g., bit-codes) with corresponding program data (e.g., program bits). For example, bit-codes may comprise encoded bit sequences used to encode portions of program bits to allow for a reduction of zero-bits or one-bits in the encoded sequences as compared to the program bits. The process of encoding may include first partitioning program data into two or more portions. As mentioned above, a memory cell array may comprise a PCM cell array, wherein a one-bit state corresponds to a crystalline set state of a PCM cell and a zero-bit state corresponds to an amorphous reset state of the PCM cell.

In an embodiment, a memory device may comprise a controller to encode program bits to be written to a memory cell array, and to program the encoded program bits in a program order based, at least in part, on a bit-value of individual encoded program bits. For example, a controller may program encoded program bits in a program sequence based, at least in part, on whether individual encoded program bits comprise one-bits or zero-bits. Encoding program bits to be written to a memory cell array may provide an opportunity to reduce a number of one-bits or zero-bits, as desired. Encoded program bits may be written to a memory cell array by writing substantially all zero-bits to the memory cell array before writing substantially all one-bits to the memory cell array, or vice versa.

In one implementation, a controller of a memory device may comprise circuitry to encode program bits to be written to a memory cell array, wherein such encoding may be based, at least in part, on an ordering of bit values (e.g., zero-bit or one-bit) of the program bits. In another implementation, a controller may encode program bits based, at least in part, on an ordering of bit values of the program bits and a table comprising codes corresponding to the ordering of bit values of the program bits. For example, such codes may comprise bit sequences to encode the program bits so as to result in a reduction of a number of one-bits or zero-bits. Though memory cells may comprise PCM cells, claimed subject matter is not so limited. For example, encoding program bits to be written to a memory array may be performed as described herein for other types of memory (e.g., flash) for any number of reasons.

As noted above, any string of data bits programmed in parallel will tend take as long to program as the slowest type of bit to program in among the parallel bits. If programmed in the sequence received, random strings of bits to be programmed in parallel will most often include both zero-bits and one-bits, even more so with greater parallelism (numbers of bits that can be simultaneously programmed in parallel), such that the average programming speed tends to be dominated by the type of bit with the greatest programming latency. In a method whereby the order of the program bits is changed, such that bits of one type are grouped for programming ahead of bits of another type, the average programming speed can be reduced proportionately to the number of bits to be programmed of the type that has the lowest programming latency.

As an example only, and without limitation, if in a PCM embodiment zero-bits have a programming latency of about 50 ns and one-bits have a programming latency of about 500 ns, programming in the order received may entail an average programming latency of slightly less than 500 ns (e.g., around 450-495 ns) per bit. Changing the order of programming such that strings of all zero-bits are programmed together, before or after strings of all one-bits are programmed, can reduce the average programming latency to closer to half-way between the latencies for the bits of different types (e.g., around 250-300 ns) if about half of the bits to be written are zero-bits. In this example, changing the order of programming bits can reduce programming time for a page of data (which may represent, for example, N bytes where N=64, 128, 256, etc.) by more than 30% relative programming in the order that the programming bits are received. Employing prior encoding to minimize one-bits can even further reduce the average programming latency. Accordingly, changing the programming order can entail significant savings in program times.

FIG. 1 is a plot 100 of characteristics of bias signal waveforms, according to an embodiment. A PCM cell may be reset (e.g., to a zero-bit information state) by melting phase change material by applying a relatively high amplitude, relatively short duration electrical programming pulse or bias signal 120. In a reset state, an active region of phase change material may comprise an amorphous region disposed adjacent to a heater element in a PCM cell, for example. In other embodiments, an amorphous region can be produced in a self-heating PCM cell without a separate heater element. Crystallized phase change material may surround such an amorphous region. In such a state, a PCM cell may have a relatively high electrical resistance. In a subsequent process, a PCM cell may be set (e.g., to a one-bit information state) by crystallizing an amorphous region so that a continuous current path through the phase change material, such as substantially all of the phase change material for the cell, may be crystalline. Such a process may involve ramping down a voltage and/or current of relatively low amplitude, relatively long duration programming pulse 110 applied to a PCM cell to crystallize its phase change material. In such a state, a PCM cell may have a relatively low electrical resistance. Such a process of crystallizing an amorphous region may be performed relatively quickly in order to benefit operational performance (e.g., speed) of the PCM cell. However, performing such crystallization too quickly may result in non-crystallized amorphous regions and/or imperfections in the phase change material, resulting in a higher-than-desired electrical resistance. In other words, such a crystallization process may involve a ramping-down programming pulse that provides enough time to fully crystallize an amorphous region without adversely producing amorphous regions and/or imperfections. Thus, a process of determining setting rate for a PCM cell may involve a trade-off between PCM write speed and assuring that a high percentage of the phase change material is crystallized. Accordingly, programming a PCM cell may involve different latencies, wherein a process to store a one-bit may be slower than a process to store a zero-bit. For example, programming pulse 110 to program a one-bit may take a duration 115 longer a duration 125 to program a zero-bit using programming pulse 120. Therefore, as discussed above, it may be desirable to reduce a number of one-bits in a plurality of program bits to be written to memory.

Figure 2:
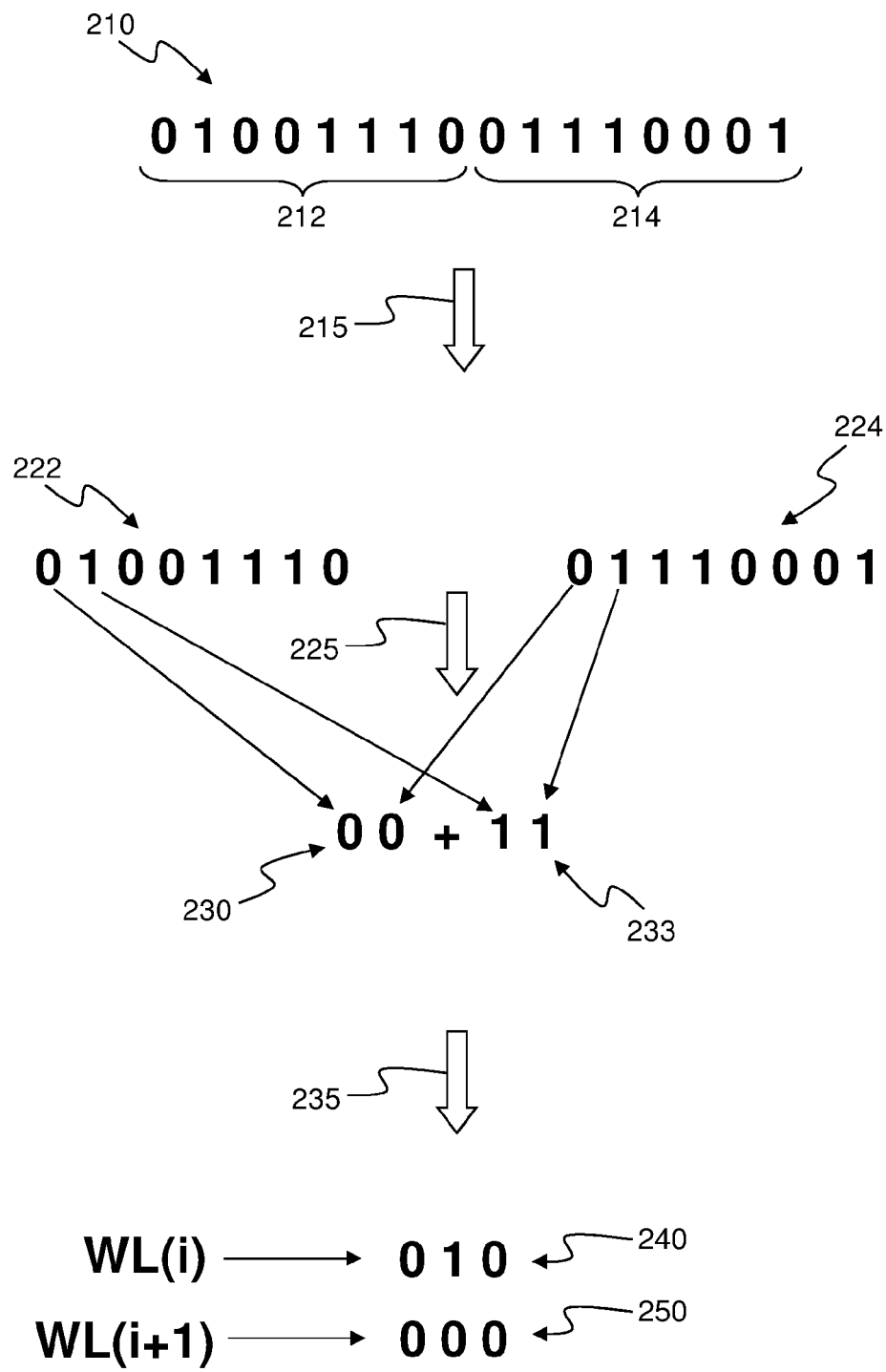
FIG. 2 shows a flow diagram of a process to encode program bits to be programmed in a memory array, according to an embodiment.

FIG. 2 is a flow diagram of an embodiment of a process 200 to encode a group 210 of data bits representing binary states to be programmed in a memory array, for example. Process 200 may comprise a technique to reduce a number of one-bits in a plurality of program bits to be written to a memory array. Group 210 data bits to be programmed (program bits) may comprise a byte, a word, or several bits to several hundred data bits, just to name a few examples. Though the claimed subject is not so limited, the process 200 may include partitioning the program bits into two or more portions. Partitioning into smaller groups facilitates encoding by use of a look-up table without unduly lengthy look-up tables; however, encoding by use of an algorithm can be used in addition to or in place of look-up tables. In one implementation, group 210 may comprise an upper-significant-bits portion 212 and a lower-significant-bits portion 214. Each portion may comprise a same number of bits, though claimed subject matter is not so limited. In process portion 215, group 210 may be partitioned into portions 212 and 214, resulting in bit group 222 and bit group 224. In process portion 225 a combination of bits 230 and 233 may be created from a particular combination of bits of bit group 222 and bit group 224. Though any of a number of possible combinations may be used, in one particular implementation most-significant bits from each of bit group 222 and bit group 224 may be combined to create bit combination 230, as shown by arrows in FIG. 2. Also, next most-significant bits from each of bit group 222 and bit group 224 may be combined to create bit combination 233, also shown by arrows in FIG. 2. In process portion 235, a look-up table, for example, may be used arrive at bit groups 240 and 250. Bit groups 240 and 250 may respectively comprise encoded bits to be programmed to a memory cell array, as shown in detail below. In one implementation, a look-up table may be used to associate bit values of bit group 222 and bit group 224 with a corresponding table value to give bit groups 240 and 250. An example of such a table is shown in Table 1.

TABLE I

| Line number | Combined Bit combination 230 and bit combination 233 | First wordline | Second wordline |
| --- | --- | --- | --- |
| 1 | 0000 | 101 | 010 |
| 2 | 0001 | 001 | 000 |
| 3 | 0010 | 100 | 000 |
| 4 | 0011 | 010 | 000 |
| 5 | 0100 | 100 | 000 |
| 6 | 0101 | 100 | 001 |
| 7 | 0110 | 100 | 010 |
| 8 | 0111 | 001 | 000 |
| 9 | 1000 | 010 | 101 |
| 10 | 1001 | 000 | 001 |
| 11 | 1010 | 000 | 100 |
| 12 | 1011 | 000 | 010 |
| 13 | 1100 | 000 | 100 |
| 14 | 1101 | 001 | 100 |
| 15 | 1110 | 010 | 100 |
| 16 | 1111 | 000 | 001 |

Table I may comprise values so that a number of one-bits in group 210 of data bits to be programmed in a memory array is reduced. Of course, tables comprising values different from those in Table I may be used, and Table I is merely an example. In other examples, an algorithm can be applied to generate encoded bits to be programmed that have reduced one-bits relative to the original program bits. In still other examples, an algorithm or look-up table can be configured to generate encoded bits with reduced zero-bits. Moreover, either a look-up table or an algorithm can encode program bits to reduce one type of data (one-bits or zero-bits, without or without intervening partitioning 215 and combining 235. In the example shown in FIG. 2, bit sequence 230 and bit sequence 233 may be combined to form a bit string 0011, located in line 4 of Table I. Thus, from line 4 of Table I, bit string 0011 corresponds to a bit group 240 comprising bits 010 and a bit group 250 comprising bits 000. In one implementation, bits of bit group 240 may be placed on wordline WL(i) and bits of wordline bit group 250 may be placed on another wordline WL(i+1). Here, a reduced number of one-bits, compared to group 210 of data bits, may be placed on wordlines to program a memory cell array. In fact, use of any other components of lines 1 through 16 of Table I may result in a reduction of one-bits placed on wordlines for programming a memory cell array, relative to the original program bits.

In another embodiment, a look-up table, such as Table I described above, need not be used to arrive at bit groups 240 and 250. Circuitry comprising logic components, for example, may be used instead of or in addition to a look-up table such as Table I. Such circuitry may be included in a memory controller and/or peripheral circuitry of a memory array, though claimed subject matter is not so limited. For example, instead of using a look-up table with a bit sequence 230 and bit sequence 233, as described above, bit sequences 230 and 233 may be provided to a combination of logic components interconnected so as to produce encoded bit groups 240 and 250.

As described so far, process 200 may allow for a portion of a group of bits 210 to be encoded into bit groups 240 and 250. Repeating at least some portions of process 200, additional bits from bit group 222 and bit group 224 may be used to create other bit sequences 230 and 233 during process portion 225. In one particular implementation, most-significant bits from each of bit group 222 and bit group 224 that have yet to be used in process portion 225 (such as that described above, for example) may be combined to create bit sequence 230. Also, next most-significant bits from each of bit group 222 and bit group 224 may be combined to create bit sequence 233. In process portion 235, a look-up table, an algorithm or both, for example, may be used to arrive at bit groups 240 and 250, as described above. Bit groups 240 and 250 may be appended to previously determined bit groups 240 and 250. Such an iterative process may continue until all bits of bit group 222 and bit group 224 have been encoded by process portions 225 and 235, for example. Of course, such details of process 200 are merely examples, and claimed subject matter is not so limited. For example, as noted previously, program bits need not be partitioned. Furthermore, in other embodiments, encoding can be performed with reduced overhead, such as building a look-up table with 5 output bits for every 4 input bits. As an example only, and without limitation, output from encoding can comprises add a zero-bit and inverting the data only when the number of zero-bits in the output from such operation is reduced.

Figure 3:
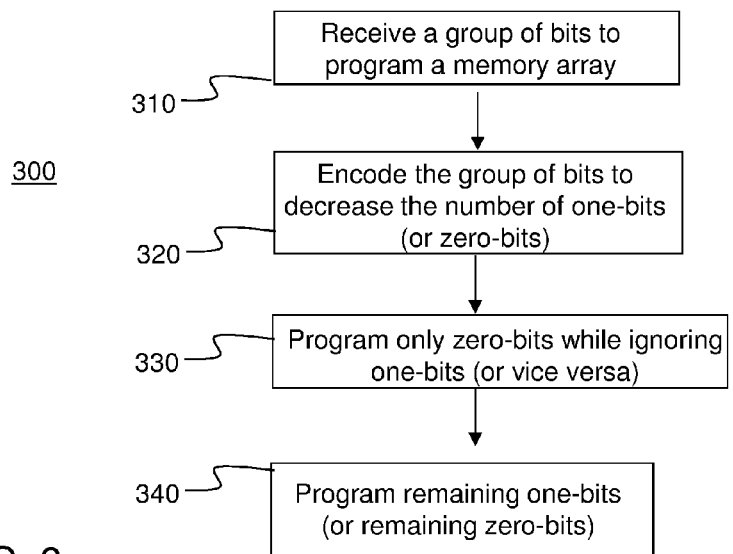
FIG. 3 is a flow diagram of a process to change an order of program bits to be programmed in a memory array, according to an embodiment.

FIG. 3 is a flow diagram of an embodiment of a process 300 to encode program bits to be programmed in a memory array. Process 300 may comprise one of an unlimited number of techniques to encode program data to reduce a number of one-bits in a plurality of program bits to be written to memory. Process 300 merely describes an example of an encoding embodiment, but other encoding techniques may be used. Also, various portions and/or details of process 300 may be changed. Accordingly, details of process 300 are merely examples, and claimed subject matter is not so limited.

At block 310, a memory controller, or other device to perform process 300, may receive a group of bits to program a memory array, for example. A group of bits may be similar to 210, shown in FIG. 2, though claimed subject matter is not so limited. As explained above, such a group of bits may comprise a byte, a word, or several to several hundred data bits, just to name a few examples. In block 320, the group of bits may be initially partitioned into two portions, though a partitioning process may partition a group of bits into any number of portions, as in the case of other implementations, for example. The group of bits may be partitioned so that half the number of bits are in one portion and the other half are in another portion. For example, returning to FIG. 2, group 210 may comprise an upper-significant bits portion 212 and a lower-significant bits portion 214 that are partitioned into bit group 222 and bit group 224. Portions of bits resulting from such a partitioning process of block 320 may be encoded to reduce a number of one-bits (reduce a number of zero-bits) in a plurality of program bits to be written to memory. As mentioned above, such encoding may be performed by any of an unlimited number of encoding techniques. In one technique, described in the example embodiment shown in FIG. 2, the most-significant bits from each of two portions of bits (e.g., bit group 222 and bit group 224) may be combined to create new bit sequences (e.g., 230 and 233). The new combination of bits may be used with a look-up table, such as Table 1, described above, to arrive at a pair of encoded program bits that, by design, comprise a reduced number of one-bits in a plurality of program bits to be written to memory. Alternatively, encoding to reduce one type of bit may be conducted without first partitioning.

At block 330, encoded program bits, comprising a reduced number of one-bits, may be written to a memory cell array by programming substantially all zero-bits of the encoded program bits and ignoring substantially all one-bits. At block 340, the one-bits may be programmed after substantially all zero-bits have been programmed. In an alternative implementation, indicated by the parentheticals in FIG. 3, encoded program bits may be written to a memory cell array by programming substantially all one-bits of the encoded program bits and ignoring substantially all zero-bits. The zero-bits may be programmed after substantially all one-bits have been programmed. Of course, such details of process 300 are merely examples, and claimed subject matter is not so limited.

Figure 4:
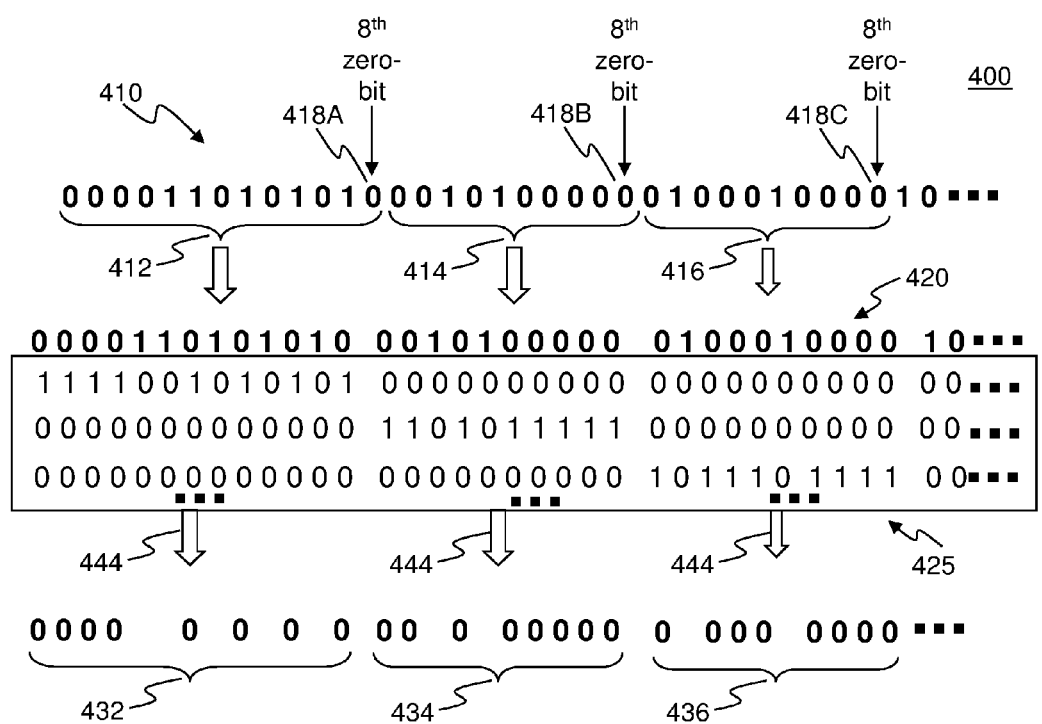
FIG. 4 shows a process to arrange program bits to be programmed in a memory array, according to an embodiment.

FIG. 4 is a flow diagram of an embodiment of a process 400 to arrange program bits 410 to be programmed in a memory array. For example (e.g., see block 330 and 340 in FIG. 3), process 400 may comprise writing program bits to a memory cell array by programming substantially all zero-bits of encoded program bits and ignoring substantially all one-bits. In such a case, the one-bits may be programmed after substantially all the zero-bits have been programmed, such as in process 500 described below. Process 400 may provide a benefit of improving program speed of a memory array having asymmetric latency, as explained above.

Program bits 410 may comprise encoded program bits. For example, program bits 410 may comprise a plurality of bits encoded by process 200, as described above. Process 200 may comprise a technique to reduce a number of one-bits in a plurality of program bits to be written to a memory array. Accordingly, program bits 410 may comprise encoded program bits that include a reduced number of one-bits compared to program bits prior to encoding (e.g., such as program bits provided by a processor executing an application). Program bits 410 may comprise a plurality of bytes, words, or several to several hundred data bits, just to name a few examples.

In a particular implementation, program bits 410 may be partitioned at particular counts of a particular bit value (e.g., one-bit or zero-bit). For example, program bits 410 may be partitioned, starting from the left-most significant bit, at an eighth zero-bit 418A, at the next eighth zero-bit 418B, at the next eighth zero-bit 418C, and so on until bits of program bits 410 are exhausted. In this particular example, a memory cell array may be programmed eight bits at a time (e.g., using an eight-bit wide parallel program bus). In another example, program bits 410 may be partitioned, starting from the left-most significant bit, at a sixteenth zero-bit 418B, at the next sixteenth zero-bit (not shown), at the next sixteenth zero-bit (not shown), and so on until bits of program bits 410 are exhausted. In this particular example, a memory cell array may be programmed sixteen bits at a time (e.g., with a sixteen-bit wide parallel program bus). Thus, such partitioning may be based, at least in part, on a number of bits that are to be programmed in a memory array at a time (e.g., 8 or 16 for the example above). The number of bits that can be programmed at a time, or in parallel, is referred to as the program parallelism. More generally, if program parallelism is n, then the program bits 410 may be partitioned after the nth bit of the bit type being programmed.

As shown in the example of FIG. 4, program bits 410, which may already be encoded to minimize one-bits (or minimize zero-bits), may be partitioned into portions 412, 414, 416, and so on. Individual such portions may include eight zero-bits for a memory device wherein eight bits are programmed at a time (e.g., an eight-bit wide parallel program bus), as explained above, though claimed subject matter is not so limited.

In one implementation, partitioned bits 420 may be used to generate a plurality of masking bits 425. The purpose of the masking bits 425 is to provide the write circuitry with the information of how many bits and where in the memory array the user bits 410 should be programmed. If, for example, a mask bit with value "1" enables the program operation and a mask bit with value "0" disables it, for the partitioned bits 420 and for an 8 bit program parallelism (setting a maximum of 8 mask bits at "1" and all the others at "0"), the mask bits 425 for the first partitioned user bits 412 comprises an inverted sequence of the first portioned portion 412 plus zero-bits for the bits of the other portioned portions 414, 416, etc., as follows:

1111001010101 0000000000 0000000000 00 . . . .

Similarly, the second mask bits for the second partitioned 414 are:

0000000000000 1101011111 0000000000 00 . . . .

Similarly, the third mask bits for the third partitioned 416 are:

0000000000000 0000000000 1011101111 00 . . . .

This process can be completed for all of the program bits 410, e.g. for each of the partitions. The number of partitions, in turn, is related to the length of the string of program bits 410 (which may be encoded program bits) and also related to the program parallelism.

Process 444 may comprise a process to mask one-bits so that only zero-bits remain to be written to a memory cell array. In detail, process 444 may logically combine partitioned bits 420 and masking bits 425 using a function to arrive at bit portions 432, 434, 436, and so on, comprising only zero-bits. As described in detail above, logic-gate circuitry may be used to perform such a function. Though bit portions 432, 434, 436, and so on, may comprise only zero-bits, bit positions (e.g., most significant bit, second-most significant bit, third-most significant bit, and so on) of individual zero-bits with respect to the original program bits 410 may determine, at least in part, which memory cells are to be programmed. In other words, zero-bits of bit portions 432, 434, 436 may generally be programmed in memory cells so that particular memory cells are skipped in anticipation of storing one-bits during a subsequent process (see, e.g., process 500, described below with respect to FIG. 5). For example, in bit portion 432, the $5^{th}$, $6^{th}$, $8^{th}$, $10^{th}$ and $12^{th}$ bit positions are skipped, corresponding to one-bits in the corresponding portion 412 of the program bits 410. Accordingly, individual memory cells corresponding to particular bit positions of zero-bits in bit portions 432, 434, and 436 may be programmed. Further, a string of all zero-bits longer than the program parallelism, and more particularly substantially all zero-bits of the original program bits 410, may be programmed while ignoring (e.g., not programming) any one-bits. For example, bit portions 432, 434, 436, and so on, comprising only zero-bits, may be written to a memory cell array without writing any one-bits. Of course, such details of process 400 are merely examples, and claimed subject matter is not so limited.

Figure 5:
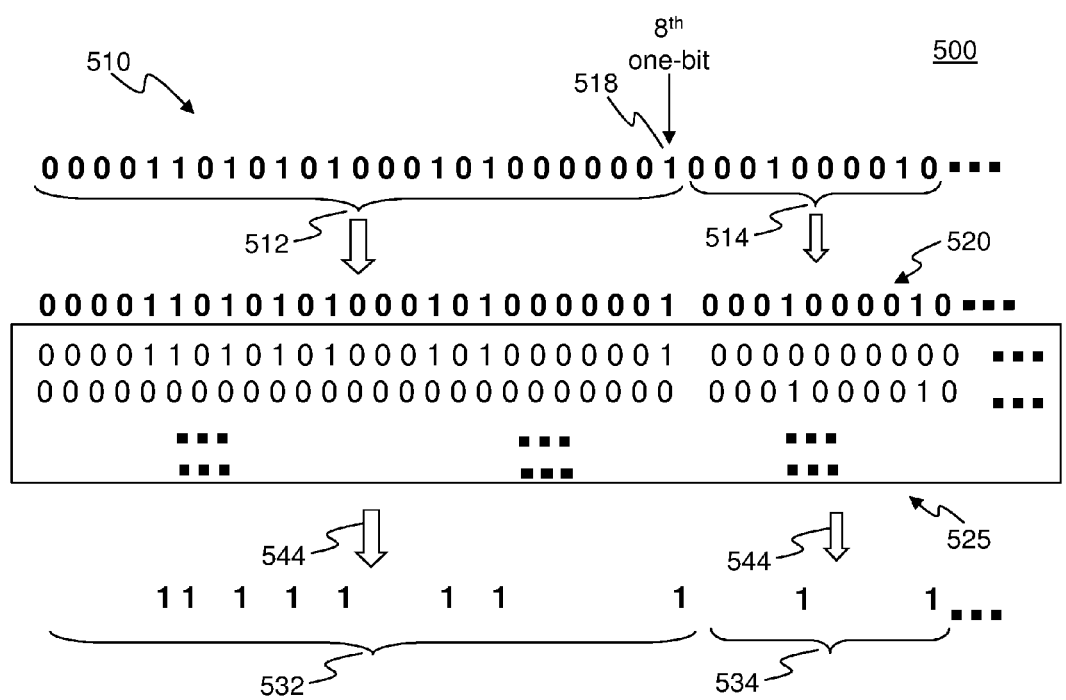
FIG. 5 shows a process to arrange program bits to be programmed in a memory array, according to another embodiment.

FIG. 5 is a flow diagram of an embodiment of a process 500 to arrange program bits 510 to be programmed in a memory array. Similar to process 400 shown in FIG. 4, for example, process 500 may comprise writing program bits to a memory cell array. However, instead of programming substantially all zero-bits of encoded program bits and ignoring substantially all one-bits, as in process 400, process 500 comprises programming substantially all one-bits of program bits (which may be encoded program bits) and ignoring substantially all zero-bits. In one implementation, process 500 may be performed subsequent to performing process 400. In another implementation, process 400 may be performed subsequent to performing process 500. In other words, subsequent to programming only one type of bit (e.g., either zero-bits or one-bits) and ignoring the other type of bit, the other type of bit may be programmed.

In a particular implementation, program bits 510 may be partitioned at particular counts of a particular bit value (e.g., one-bit or zero-bit). For example, program bits 510 may be partitioned, starting from the left-most significant bit, at an eighth one-bit 518, at the next eighth one-bit (not shown), at the next eighth one-bit (not shown), and so on until bits of program bits 510 are exhausted. In this particular example, a memory cell array may be programmed eight bits at a time (e.g., an eight-bit wide parallel program bus). In another example, program bits 510 may be partitioned, starting from the left-most significant bit, at a sixteenth one-bit (not shown), at the next sixteenth one-bit (not shown), at the next sixteenth one-bit (not shown), and so on until bits of program bits 510 are exhausted. In this particular example, a memory cell array may be programmed sixteen bits at a time (e.g., a sixteen-bit wide parallel program bus). Thus, such partitioning may be based, at least in part, on a number of bits that are to be programmed in a memory array at a time.

As shown in the example of FIG. 5, program bits 510 may be partitioned into portions 512, 514, and so on. Individual such portions may include eight one-bits for a memory device wherein eight bits are programmed at a time (e.g., an eight-bit wide parallel program bus), as explained above, though claimed subject matter is not so limited. Process 544 may comprise a process to mask zero-bits generating mask bits 525 with the same mechanism described for mask bits 425 in process 400 but now setting a mask bit at "1" for the n program bits 510 at "1", where n represents the program parallelism, and setting the mask bits at "0" for all the others, so that only one-bits remain to be written to a memory cell array. In one implementation, process 544 may include a process to logically combine partitioned bits 520 with itself (identified as 525 in FIG. 5) to arrive at bit portions 532, 534, and so on, comprising only one-bits. As described in detail below, logic-gate circuitry may be used to perform such a process.

Though bit portions 532, 534, and so on, may comprise only one-bits, bit positions (e.g., most significant bit, second-most significant bit, third-most significant bit, and so on) of individual one-bits with respect to the original plurality of bits 510 may be determine, at least in part, which memory cells are to be programmed. In other words, one-bits of bit portions 532, 534 may be programmed in memory cells so that particular memory cells are generally skipped to prevent zero-bits written in a previous process (e.g., process 400, described above with respect to FIG. 4) from being over-written. In another implementation, such particular memory cells may be generally skipped in anticipation of storing zero-bits during a subsequent process (e.g., process 400, described above with respect to FIG. 4). For example, in bit portion 532, the $1^{st}$ to $4^{th}$, $7^{th}$, $9^{th}$, $11^{th}$, $13^{th}$-$15^{th}$, $17^{th}$ and $19^{th}$-$24^{th}$ positions are skipped, corresponding to zero-bits in the corresponding portion 512 of the program bits 510. Accordingly, individual memory cells corresponding to particular bit positions of one-bits in bit portions 532, 534 may be programmed. Further, a string of all one-bits longer than the program parallelism, and more particularly substantially all one-bits of the original program bits 510, may be programmed while ignoring (e.g., not programming) any zero-bits. For example, bit portions 532, 534, and so on, comprising only one-bits, may be written to a memory cell array without writing any zero-bits. Of course, such details of process 500 are merely examples, and claimed subject matter is not so limited.

Figure 6:
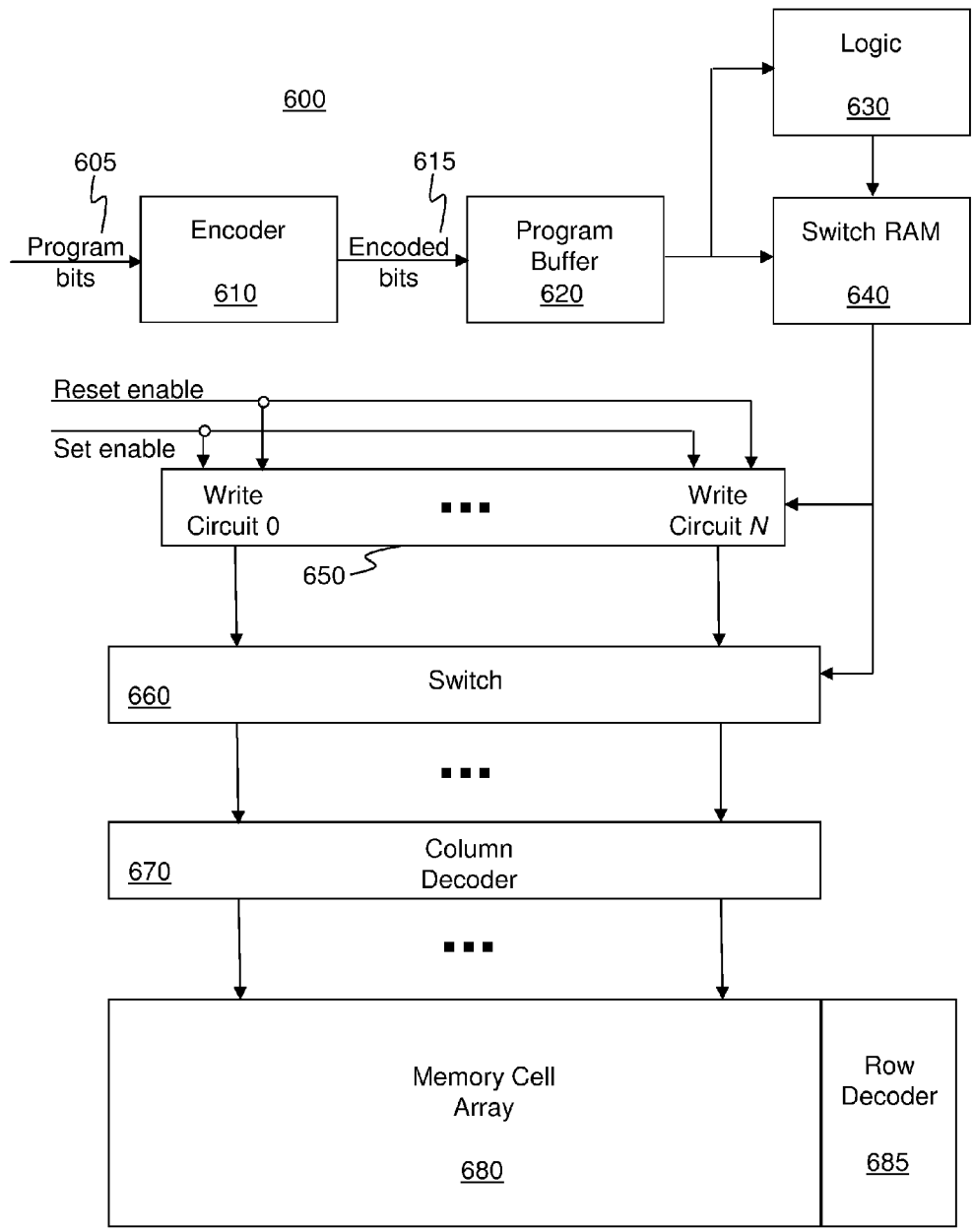
FIG. 6 is a schematic diagram illustrating an embodiment of a portion of a memory device.

FIG. 6 is a schematic diagram illustrating an embodiment of a portion of a memory device 600. For example, memory device portion 600 may perform process 300, 400, and/or 500 described above. An encoder 610 may receive a plurality of program bits 605, which may be generated by a processor executing an application, for example. Encoder 610 may encode a plurality of program bits 605 to reduce a number of zero-bits or one-bits, as described above. For example, encoder 610 may perform process 200 to encode a group of program bits 605 (e.g., bits 210) to reduce a number of one-bits in a plurality of program bits to be written to a memory array. Program bits 605 may comprise a byte, a word, or several to several hundred data bits, just to name a few examples. A program buffer 620 may be used to store encoded program bits 615 that are output by the encoder 610. Logic block 630 and/or switch RAM 640 may be used to determine addresses where zero-bits or one-bits are to be stored during a programming process, such as processes 400 or 500, for example. These addresses may be functions of the mask bits 425 (FIG. 4) and/or 525 (FIG. 5), for example. In one implementation, logic block 630 may manage timing of write operations and/or incrementing a write pulse counter, for example. Switch RAM 640 may comprise memory to store the mask bits 425 and/or 525 to drive switches in switch block 660, each said bit having been associated with the encoded and partitioned string of bits 420 of FIG. 4 or 520 of FIG. 5. In particular, every location of the switch RAM 640 can contain the mask bits which are associated to the logic configuration of the switch block 660. The switch block 660, in turn, connects the program circuitry represented by the write circuit block 650 to the memory cell array 680 in order to perform the reset or the set operation. At every write cycle driven by logic 630 and up to the completion of the programming sequence of all zero-bits (e.g., block 330 of FIG. 3) and/or of all one-bits (e.g., 340 of FIG. 3), the output of the switch RAM 640 sends out the mask bits 425 or 525 to the write circuit block 650 and to the switch block 640. As an example, if during a reset operation (when reset enable is asserted), the masks bits 425 with a value of "1" enable the write zero-bit circuits inside write circuit block 650 and corresponding switches in switch block 660, while during a set operation (when set enable is asserted), the masks bits 525 with a value of "1" enable the write one-bit circuits inside write circuit block 650 and corresponding switches in switch block 660. Write circuit block 650 may comprise a number of write circuits corresponding to a number of parallel bits to be programmed at the same time, i.e., to the program parallelism of the system. For example, if memory device portion 600 is configured to program a word at a time, then write circuit block 650 may comprise sixteen parallel write circuits to operate sixteen parallel switches in switch block 660. Write circuit 0 through write circuit N may receive a reset enable signal and/or an enable signal comprising a plurality of bits corresponding to whether all zero-bits or all one-bits are to be programmed in a current operation. For example, a reset enable signal and/or an enable signal may choose which masking bits, 425 or 525, will be used to perform process 444 or 544, respectively, as described above with respect to FIGS. 4 and 5.

In one implementation, switch block 660 may comprise a plurality of switches that are operated by switch RAM 640. For example, such switches may be driven during individual program pulses during write operations to program a memory cell array. Switches in switch block 660 may operate circuitry in a column decoder 670, which may provide signals to bit lines of memory cell array 680 to program individual bits of encoded program bits 615. For example, as described above, such individual bits may comprise all zero-bits to be programmed before (or after) programming all one-bits. A row decoder 685 may be used in conjunction with column decoder 670 to program the encoded program bits 615. Of course, such details of a portion of a memory device are merely examples, and claimed subject matter is not so limited.

Figure 7:
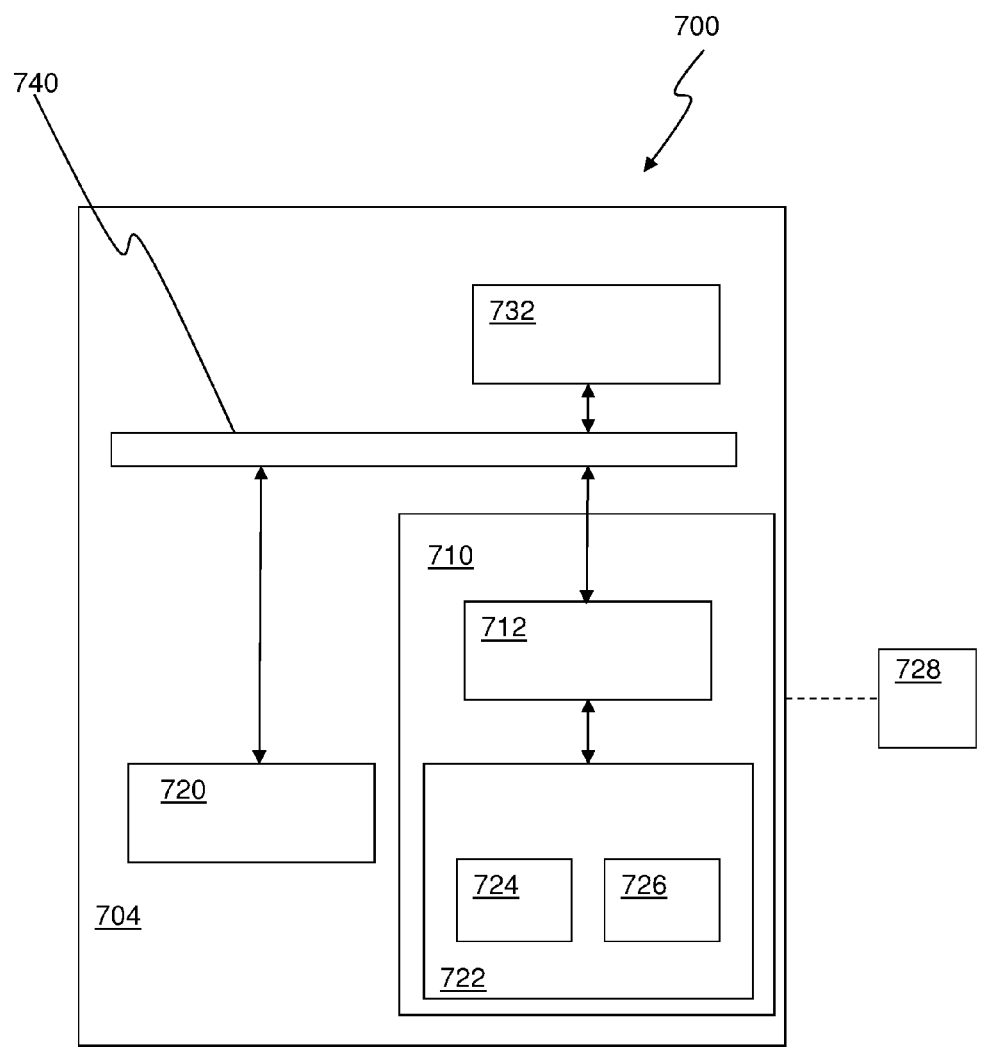
FIG. 7 is a schematic diagram illustrating an embodiment of a computing system.

FIG. 7 is a schematic diagram illustrating an embodiment of a computing system 700 including a memory device 710. Such a computing device may comprise one or more processors, for example, to execute an application or other code. For example, memory device 710 may comprise memory cell array 680, shown in FIG. 6, and may be configured to execute processes such as FIGS. 2, 3, 4 and/or 5. A computing device 704 may be representative of any device, appliance, or machine that may be configurable to manage memory device 710. Memory device 710 may include a memory controller 712 and a memory 722, which may comprise PCM, for example. By way of example but not limitation, computing device 704 may include: one or more computing devices or platforms, such as, e.g., a desktop computer, a laptop computer, a workstation, a server device, or the like; one or more personal computing or communication devices or appliances, such as, e.g., a personal digital assistant, mobile communication device, or the like; a computing system or associated service provider capability, such as, e.g., a database or information storage service provider/system; or any combination thereof.

It is recognized that all or part of the various devices shown in system 700, and the processes and methods as further described herein, may be implemented using or otherwise including hardware, firmware, software, or any combination thereof. Thus, by way of example but not limitation, computing device 704 may include at least one processing unit 720 that is operatively coupled to memory 722 through a bus 740 and a host or memory controller 712. Processing unit 720 is representative of one or more circuits configurable to perform at least a portion of an information computing procedure or process. By way of example but not limitation, processing unit 720 may include one or more processors, controllers, microprocessors, microcontrollers, application specific integrated circuits, digital signal processors, programmable logic devices, field programmable gate arrays, and the like, or any combination thereof.

Processing unit 720 may include an operating system configured to communicate with memory controller 712. Such an operating system may, for example, generate commands to be sent to memory controller 712 over bus 740. Such commands may comprise read or write commands. In response to a write command, for example, memory controller 712 may receive program bits to be written into memory 722, and change an order for writing the program bits based, at least in part, on bit values for individual ones of the program bits (e.g., zero-bits or one-bits). In one implementation, controller 712 may comprise circuitry (e.g., logic components) to program said program bits based, at least in part, on the changed order for writing the program bits. The controller may also be configured to generate the program bits by receiving a plurality of bits to be written to memory and encoding the bits to reduce one type of bits relative to another type of bits, as noted above with respect the encoder 610 (FIG. 6) and the processes of FIGS. 2 and 3 and Table I. Of course, such details of a portion of memory are merely examples, and claimed subject matter is not so limited.

Memory 722 is representative of any information storage mechanism. Memory 722 may include, for example, a primary memory 724 and a secondary memory 726. Primary memory 724 may include, for example, a random access memory, read only memory, etc. While illustrated in this example as being separate from processing unit 720, it should be understood that all or part of primary memory 724 may be provided within or otherwise co-located/coupled with processing unit 720.

Secondary memory 726 may include, for example, the same or similar type of memory as primary memory or one or more information storage devices or systems, such as, for example, a disk drive, an optical disc drive, a tape drive, a solid state memory drive, etc. In certain implementations, secondary memory 726 may be operatively receptive of, or otherwise configurable to couple to, a computer-readable medium 728. Computer-readable medium 728 may include, for example, any medium that can carry or make accessible information, code, or instructions for one or more of the devices in system 700.

Computing device 704 may include, for example, an input/output 732. Input/output 732 is representative of one or more devices or features that may be configurable to accept or otherwise introduce human or machine inputs, or one or more devices or features that may be configurable to deliver or otherwise provide for human or machine outputs. By way of example but not limitation, input/output device 732 may include an operatively configured display, speaker, keyboard, mouse, trackball, touch screen, data port, etc.

It will, of course, be understood that, although particular embodiments have just been described, claimed subject matter is not limited in scope to a particular embodiment or implementation. For example, one embodiment may be in hardware, such as implemented on a device or combination of devices, for example. Likewise, although claimed subject matter is not limited in scope in this respect, one embodiment may comprise one or more articles, such as a storage medium or storage media that may have stored thereon instructions capable of being executed by a specific or special purpose system or apparatus, for example, to result in performance of an embodiment of a method in accordance with claimed subject matter, such as one of the embodiments previously described, for example. However, claimed subject matter is, of course, not limited to one of the embodiments described necessarily. Furthermore, a specific or special purpose computing platform may include one or more processing units or processors, one or more input/output devices, such as a display, a keyboard or a mouse, or one or more memories, such as static random access memory, dynamic random access memory, flash memory, or a hard drive, although, again, claimed subject matter is not limited in scope to this example.

In the preceding description, various aspects of claimed subject matter have been described. For purposes of explanation, specific numbers, systems, or configurations may have been set forth to provide a thorough understanding of claimed subject matter. However, it should be apparent to one skilled in the art having the benefit of this disclosure that claimed subject matter may be practiced without those specific details. In other instances, features that would be understood by one of ordinary skill were omitted or simplified so as not to obscure claimed subject matter. While certain features have been illustrated or described herein, many modifications, substitutions, changes, or equivalents may now occur to those skilled in the art. It is, therefore, to be understood that the appended claims are intended to cover all such modifications or changes as fall within the true spirit of claimed subject matter.

What is claimed is:

1. A method comprising:
   receiving a plurality of bits to be written to a memory cell array, wherein the plurality of bits comprises zero-bits and one-bits;
   generating program bits by encoding the plurality of bits so as to reduce a number of zero-bits or one-bits to be written relative to the plurality of bits; and
   changing an order of writing said program bits to said memory cell array based, at least in part, on bit values of individual ones of said program bits.

2. The method of claim 1, wherein said encoding said plurality of bits comprises:
   using a table comprising codes corresponding to said plurality of bits.

3. The method of claim 2, wherein said encoding said plurality of bits comprises partitioning said plurality of bits into two or more portions.

4. The method of claim 3, wherein said codes comprise bit groups to encode said two or more portions of said plurality of bits to result in said reduction of zero-bits or one-bits.

5. The method of claim 3, wherein said encoding said plurality of bits further comprises:
   combining a particular number of bits from individual ones of said two or more portions; and
   using a table comprising codes corresponding to the combined bits.

6. The method of claim 1, wherein said memory cell array comprises a phase change memory (PCM) cell array.

7. The method of claim 6, wherein writing a one-bit to a PCM cell of said PCM cell array comprises producing a crystalline set state and writing a zero-bit to said PCM cell comprises producing an amorphous reset state.

8. The method of claim 7, wherein a total number of bits in the program bits is greater than a total number of bits in the plurality of bits, and wherein a number of one-bits in the program bits is less than a number of one-bits in the plurality of bits.

9. The method of claim 1, wherein said changing the order of writing said program bits comprises masking said program bits.

10. The method of claim 1, further comprising:
    programming substantially all zero-bits of said program bits while not programming zero-bits; and programming substantially all one-bits of said program bits while not programming zero-bits.

11. The method of claim 10, wherein said programming substantially all zero-bits is conducted prior to said programming substantially all one-bits.

12. The method of claim 1, further comprising programming said program bits after said changing the order, wherein said programming comprises reducing programming time, relative to programming said program bits without changing the order, by an amount proportionate to a number of bits to be programmed of a type that has a lowest programming latency.

13. A method comprising:
receiving program bits to be written to a memory cell array, said program bits comprising zero-bits and one-bits; and
changing an order of writing said program bits to said memory cell array based, at least in part, on bit values of individual ones of said program bits,
wherein said changing the order of writing said program bits comprises partitioning said program bits into groups after every nth bit of a particular bit value, where n is a program parallelism.

14. The method of claim 13, wherein said partitioning said program bits comprises partitioning after every $n^{th}$ zero-bit for programming all zero-bits of said program bits in sequence, and partitioning after every nth one-bit for all programming one-bits of said program bits in sequence.

15. The method of claim 13, further comprising programming n zero-bits in parallel for each group of partitioned program bits, and subsequently programming n one-bits in parallel for each group of partitioned program bits.

16. A non-volatile memory device comprising:
a memory cell array;
an encoder configured to receive a plurality of bits to be written to the memory cell array, wherein the encoder is configured to encode the plurality of bits to generate program bits, wherein the program bits comprise a fewer number of one-bits or zero-bits relative to the plurality of bits; and
a controller configured to:
receive the program bits to be written to said memory cell array, and
change an order of writing said program bits to said memory cell array based, at least in part, on bit values of individual ones of said program bits.

17. The non-volatile memory device of claim 16, wherein said bit values of individual one of said program bits comprise a zero-bit or a one-bit.

18. The non-volatile memory device of claim 16, wherein said controller comprises:
circuitry to program said program bits in the changed order of writing said program bits.

19. The non-volatile memory device of claim 18, wherein said controller is configured to program said program bits with a programming time that is reduced, relative to a programming time for said program bits without changing the order, by an amount proportionate to a number of bits in said program bits of a type that has a lower program latency compared to bits of other types.

20. The non-volatile memory device of claim 18, wherein said controller is configured to program substantially all zero-bits of said program bits while not programming zero-bits; and program substantially all one-bits of said program bits while not programming zero-bits.

21. The non-volatile memory device of claim 18, wherein said encoder comprises a table comprising codes corresponding to said plurality of bits.

22. The non-volatile memory device of claim 21, wherein said encoder is configured to partition said plurality of bits into two or more portions and said codes comprise bit groups corresponding to said portions to encode said program bits to lead to a reduction of a number of zero-bits or one-bits.

23. The non-volatile memory device of claim 16, wherein said memory cell array comprises a phase change memory (PCM) cell array.

24. The non-volatile memory device of claim 16, wherein a program time to write a one-bit to said memory cell array is greater than that of a zero-bit.

25. The non-volatile memory device of claim 24, wherein a total number of bits in the program bits is greater than a total number of bits in the plurality of bits, and wherein a number of one-bits in the program bits is less than a number of one-bits in the plurality of bits.

26. A non-volatile memory device comprising:
a memory cell array; and
a controller configured to:
receive program bits to be written to said memory cell array, and
change an order of writing said program bits to said memory cell array based, at least in part, on bit values of individual ones of said program bits,
wherein said controller is configured to change the order of writing said program bits by partitioning said program bits into groups after every nth bit of a particular bit value, where n is a program parallelism of a program bus coupled to the non-volatile memory device.

* * * * *